United States Patent [19]
Nikami

[11] 3,942,042
[45] Mar. 2, 1976

[54] PULSE WAVEFORM GENERATOR CIRCUIT
[75] Inventor: Akira Nikami, Yokohama, Japan
[73] Assignee: Sony Corporation, Tokyo, Japan
[22] Filed: Sept. 25, 1974
[21] Appl. No.: 509,307

[52] U.S. Cl............. 307/268; 307/247 R; 328/158; 360/64
[51] Int. Cl.² ..................... H03K 3/00; G11B 21/08
[58] Field of Search........ 302/261, 268, 269, 247 R, 302/260; 328/61, 156–158, 189, 204; 360/64, 106

[56] References Cited
UNITED STATES PATENTS

| | | | |
|---|---|---|---|
| 3,157,739 | 11/1964 | Okamura | 360/64 X |
| 3,441,342 | 4/1969 | Ball et al. | 307/269 X |
| 3,798,556 | 3/1974 | Ooya et al. | 307/268 |

*Primary Examiner*—John Zazworsky
*Attorney, Agent, or Firm*—Hill, Gross, Simpson, Van Santen, Steadman, Chiara & Simpson

[57] ABSTRACT

A pulse waveform generator circuit which is suitable for integrated circuit construction is disclosed. The invention functions as a square-wave generator for switching the outputs of tape scanning heads in a video tape recorder. The circuit includes: a first pulse generator for producing a first pulse signal with a predetermined pulse width and a second pulse generator which produces a second pulse signal with predetermined pulse width between two of the adjacent first pulse signals; a flip-flop circuit set by the first pulse signal at its leading edge and reset by the second pulse signal at its leading edge; a first logic circuit which is supplied with an output signal from the flip-flop circuit and the second pulse signal to produce a third pulse signal which is held in one state from the trailing edge of the second pulse signal to the leading edge of the first pulse signal; and a second logic circuit which is supplied with the third and first pulse signals to produce a desired pulse signal. In this case, the desired pulse signal is reversed at each of the trailing edges of the first and second pulse signals.

12 Claims, 21 Drawing Figures

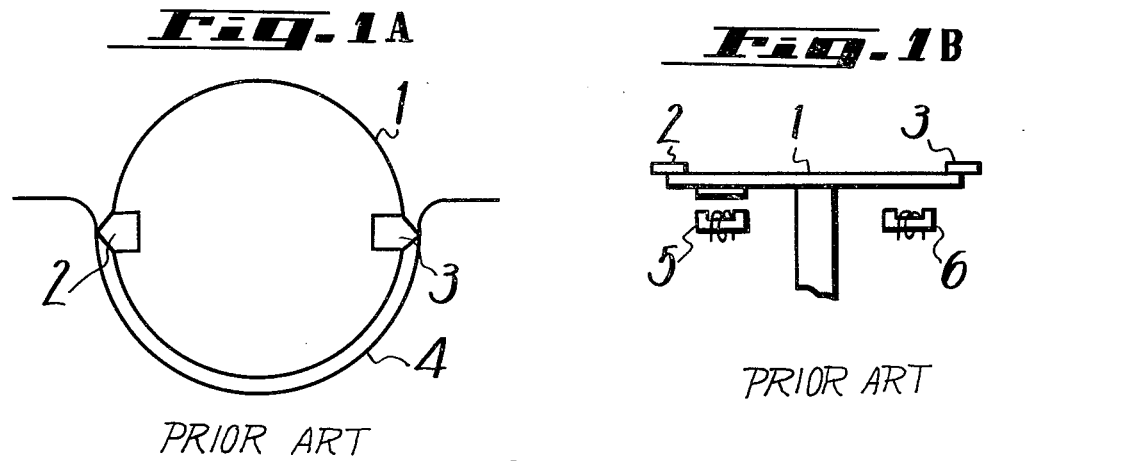
Fig. 1A
Fig. 1B
PRIOR ART
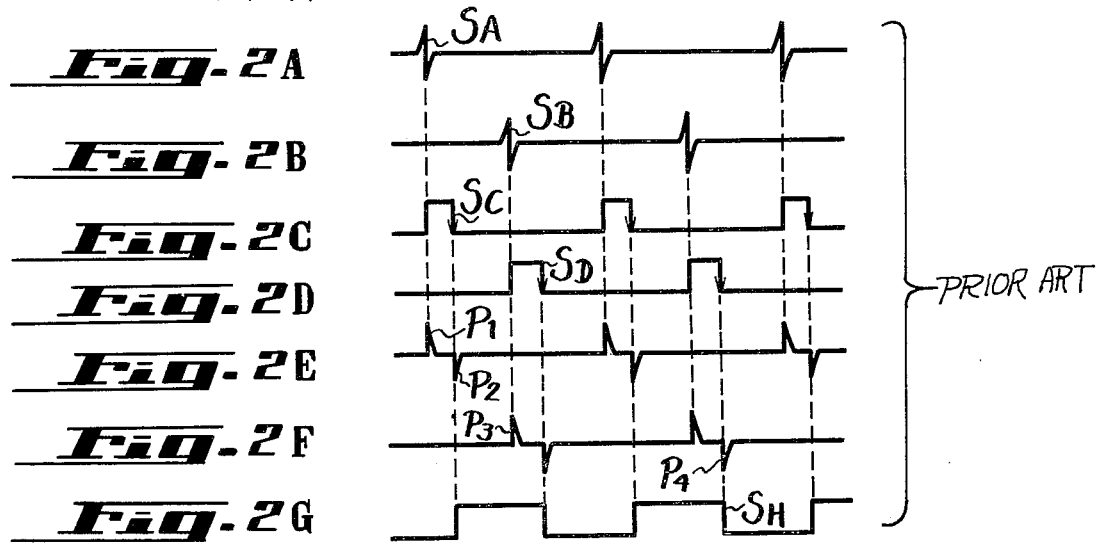
Fig. 2A
Fig. 2B
Fig. 2C
Fig. 2D
Fig. 2E
Fig. 2F
Fig. 2G
PRIOR ART
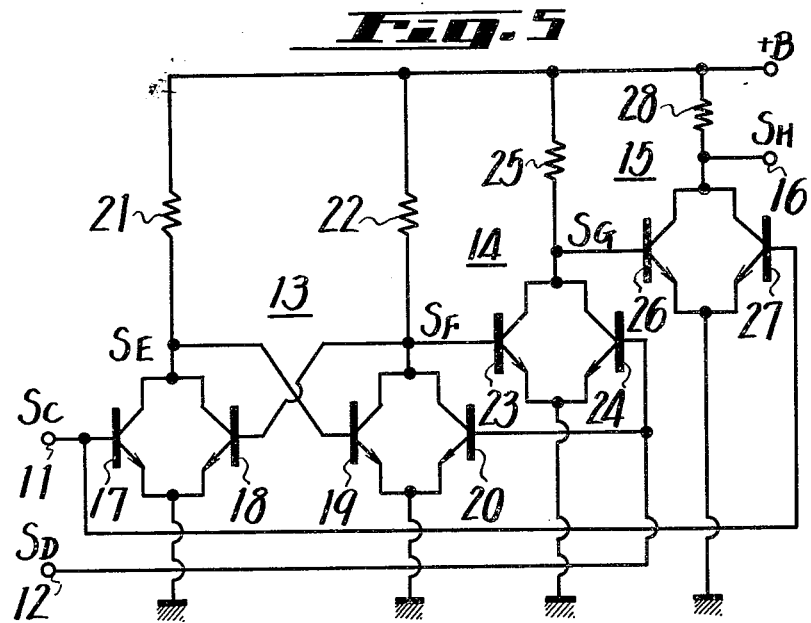
Fig. 5

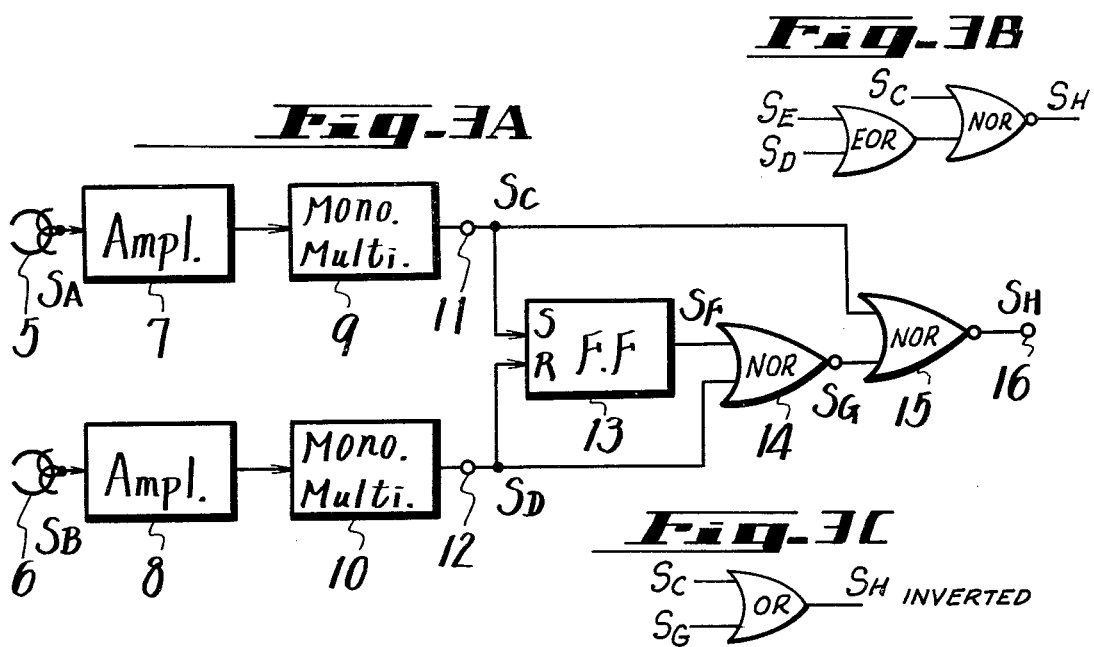
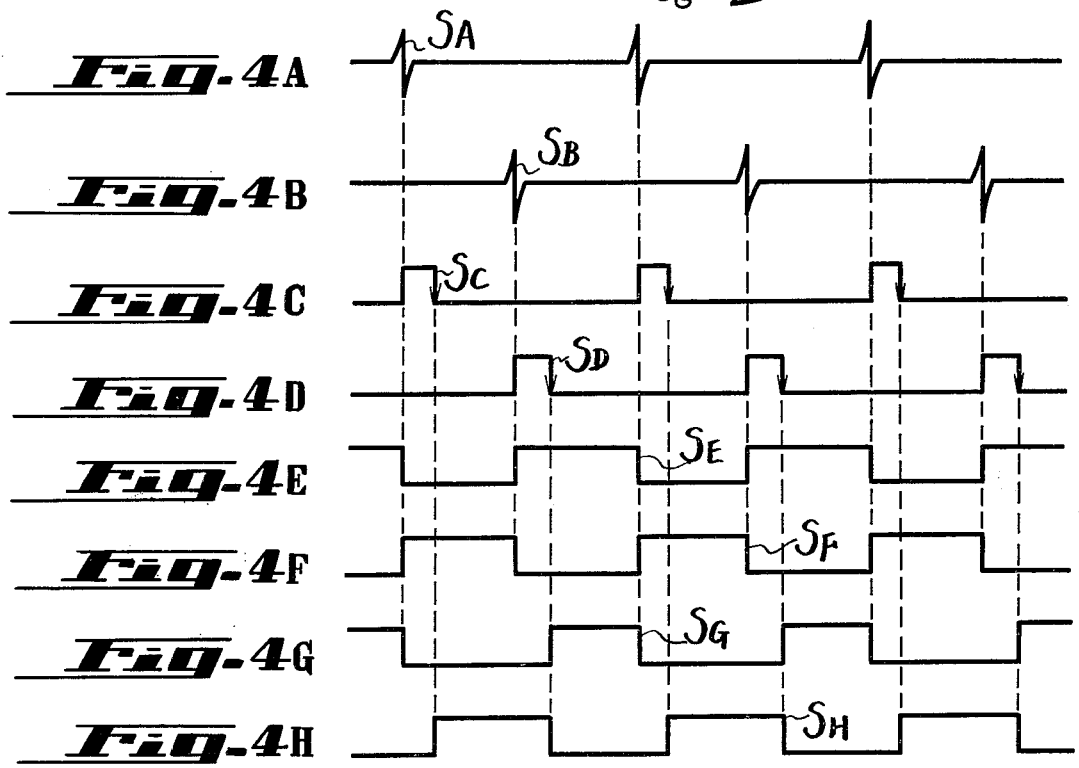

PULSE WAVEFORM GENERATOR CIRCUIT

BACKGROUND OF THE INVENTION

1. Field of the Invention

The present invention relates generally to a pulse waveform generator circuit, and more particularly to a pulse wave-form generator circuit for use as a tape head switching device in a video tape recorder and which can be easily made as an integrated circuit.

2. Description of the Prior Art

In an apparatus which can record a video signal on a magnetic tape and then reproduce a recorded video signal from the magnetic tape, as shown in FIG. 1A, there is employed a rotary magnetic head assembly in which two rotary magnetic heads 2 and 3 are attached to a rotary body 1 with an angular distance of 180°. A magnetic tape 4 travels around the rotary body 1 with an angular range of about 180° in an oblique direction with respect to the rotary surface of the rotary magnetic heads 2 and 3.

With this kind of apparatus, it is required that output signals from the two rotary magnetic heads 2 and 3 must be switched over one to the other in order to create a continuous output signal which has no overlapping portion. To achieve this purpose, two pulse producers 5 and 6 are provided for detecting the pass by of the rotary magnetic heads 2 and 3, as shown in FIG. 1B. The pulse signals obtained from the pulse producers 5 and 6 are used to trigger switching pulse signals for controlling the output signals from the two rotary magnetic heads 2 and 3 and also for coordinating the head positions with respect to the frames or fields of the video signal.

The present state of the art method for generating a video tape head switching signal will be described with reference to FIGs. 2A to 2G.

A pulse signal $S_A$ derived from one of the pulse producers 5 or 6 shown in FIG. 2A is applied to a mono-stable multivibrator (not shown) which may produce a pulse signal $S_C$ with a predetermined pulse width as shown in FIG. 2C. A pulse signal $S_B$ shown in FIG. 2B is obtained from the other pulse producer and is applied to another mono-stable multivibrator (not shown) which may produce a pulse signal $S_D$ with a predetermined pulse width as shown in FIG. 2D. The reason for the predetermined pulse widths of signals $S_C$ and $S_D$ is that the positioning of the pulse producers 5 and 6 is carried out electrically. The pulse producers 5 and 6 are located in such manner a manner the pulse signals $S_A$ and $S_B$ are derived shortly before the time when the video output signals from the magnetic heads 2 and 3 are to be switched, and the time constants of the above two mono-stable multivibrators, that is the pulse widths of the pulse signals $S_C$ and $S_D$, are suitably selected such that the trailing edges of the pulse signals $S_C$ and $S_D$ coincide with times when the video output signals from the heads 2 and 3 are to be switched. As a result, there is no need to locate the pulse producers 5 and 6 at precise, predetermined positions, and hence, rough positioning of the units is permissible.

A desired waveform for switching the video output signals from the heads 2 and 3 is shown in FIG. 2G by $S_H$. This pulse signal $S_H$ is reversed sequentially at the trailing edges of the pulse signals $S_C$ and $S_D$. In order to obtain a desired pulse signal $S_H$, the pulse signal $S_C$ is usually applied in the prior art to a differentiation circuit (not shown) to produce differentiated pulses $P_1$ and $P_2$, shown in FIG. 2E, while the other pulse signal $S_D$ is applied to another differentiation circuit (not shown) to produce differentiated pulses $P_3$ and $P_4$ shown in FIG. 2F. The pulse signals $P_2$ and $P_4$ obtained at the trailing edges of the pulse signals $S_C$ and $S_D$ are applied to a flip-flop circuit (not shown) to reverse the same sequentially and to produce the switching pulse signal or waveform $S_H$.

However, the disadvantage associated with the above prior art device is the difficulty in converting to an integrated circuit. The differentiation circuits above made use of capacitors, and as the number of parts to be connected externally to an integrated circuit increases the number of external terminals undesirably increases.

SUMMARY OF THE INVENTION

It is an object of the present invention to provide a novel pulse waveform generator circuit which is suitable for construction as an integrated circuit.

More specifically, it is an object of this invention to eliminate the need for external components which cannot be included within an integrated circuit and use additional terminals, thereby increasing cost.

It is further an object of the present invention to provide a pulse waveform generator which uses circuitry elements commonly used in integrated circuits.

In accordance with the present invention, there is provided a pulse waveform generator circuit which has a first pulse generator including a pulse producer and mono-stable multivibrator producing a first pulse signal with a predetermined pulse width. A similar second pulse generator also produces a second pulse signal with a predetermined width which is timed for generation between two adjacent first pulse signals. A four transistor flip-flop circuit is set by the first pulse signal at its leading edge and reset by the second pulse signal. A first logic circuit including two transistors in a NOR logic arrangement is supplied with the output signal from the flip-flop circuit and with the second pulse signal and produces a third pulse signal, which is held in one state from the trailing edge of the second pulse signal to the leading edge of the first pulse signal. A second two transistor NOR logic circuit is supplied with the third and first pulse signals to produce the desired pulse signal for switching the tape head outputs. This desired waveform is shaped such that a transition of levels occurs upon the arrival of the trailing edges of the first or second pulse signals.

The above arrangement achieves the objectives strived for by eliminating the use of capacitors.

Other objects, features, and advantages of the invention will become apparent from the following description taken in conjunction with the accompanying drawings.

BRIEF DESCRIPTION OF THE DRAWINGS

FIG. 1A is a plan view of the main part of a magnetic video tape recording and reproducing apparatus to which the present invention is applicable;

FIG. 1B is a side view of the main part of the magnetic recording and reproducing apparatus shown in FIG. 1A;

FIGS. 2A to 2G, inclusive, are waveform diagrams used for explaining a prior art circuit which produces a pulse signal for switching the output signals from two rotary magnetic heads shown in FIGS. 1A and 1B;

FIG. 3A is a systematic block diagram showing an embodiment of the pulse waveform generator circuit according to the invention;

FIGS. 3B and 3C illustrate alternate embodiments of the pulse waveform generator circuit according to the invention;

FIGS. 4A to 4H, inclusive, are wave-form diagrams used for explaining the embodiment of the invention shown in FIG. 3; and FIG. 5 is a circuit diagram showing a practical embodiment of the main part of the embodiment shown in FIG. 3.

DESCRIPTION OF THE PREFERRED EMBODIMENT

A preferred embodiment of the pulse waveform generator circuit according to the present invention will be now described with reference to FIG. 3A and FIGS. 4A to 4H.

In the embodiment of the invention shown in FIG. 3A, the pulse signal $S_A$ (refer to FIG. 4A) obtained from the pulse producer 5 is applied through an amplifier 7 to a mono-stable multivibrator 9 which produces at its output terminal 11 the pulse signal $S_C$ with a predetermined pulse width (refer to FIG. 4C), while the pulse signal $S_B$ (refer to FIG. 4B) obtained from the pulse producer 6 is applied through an amplifier 8 to a second mono-stable multivibrator 10 which produces at its output terminal 12 the pulse signal $S_D$ with a predetermined pulse width (refer to FIG. 4D).

The pulse signal $S_C$ is directly applied to a flip-flop circuit 13 of a set-reset type (RS-type) flip-flop circuit 13 at its SET input terminal, and the pulse signal $S_D$ is directly applied to the RESET input terminal of the RS-type flip-flop circuit 13. With the type of pulse signals $S_C$ and $S_D$ shown in FIGS. 4C and 4D, they can't directly trigger the RS-type flip-flop circuit 13 at their trailing edges, but can do so at their leading edges. Hence, the RS-type flip-flop circuit 13 is set by the pulse signal $S_C$ at its leading edge and is reset by the pulse signal $S_D$ at its leading edge. As a result, the RS-type flip-flop circuit 13 produces pulse signals or waveforms $S_E$ and $S_F$, shown in FIGS. 4E and 4F, respectively. The pulse signals $S_E$ and $S_F$, which are of opposite polarity with respect to each other, change levels at every leading edge of the pulse signals $S_C$ and $S_D$. Since triggering on the trailing edge is desired, the pulse signal $S_E$ or $S_F$ and the pulse signal $S_C$ or $S_D$ are applied to logic circuits to produce a desired waveform $S_H$ which changes level on the trailing edges of the pulse signals $S_C$ and $S_D$ (refer to FIG. 4H).

In the invention, NOR-circuits are used as first and second logic circuits 14 and 15. The pulse signal $S_F$ delivered from the RS-type flip-flop circuit 13 and the pulse signal $S_D$ are applied to the first logic circuit or NOR-circuit 14. The NOR-circuit 14 produces a pulse signal or waveform $S_G$ which remains in the same state from the trailing edge of the pulse signal $S_D$ to the leading edge of the pulse signal $S_C$ as shown in FIG. 4G. The pulse signal $S_G$ and the pulse signal $S_C$ are applied to the second logic circuit or NOR-circuit 15 to produce at its output terminal 16 the desired pulse signal or waveform $S_H$ which changes level at each of the trailing edges of the pulse signals $S_C$ and $S_D$ as described above.

A practical embodiment of the circuit elements between the terminals 11, 12 and 16 is shown in FIG. 5, now to be described. The emitters of four transistors 17, 18, 19 and 20 are grounded, the collectors of the transistors 17 and 18 are jointly connected through a resistor 21 to a voltage source of +B, the connection point of the collectors of the transistors 17 and 18 is connected to the base of the transistor 19, the collectors of the transistors 19 and 20 are jointly connected through a resistor 22 to the voltage source of +B, and the junction of the collectors of the transistors 19 and 20 is connected to the base of the transistor 18 to form the RS-type flip-flop circuit 13. If the pulse signal $S_C$ is directly applied to the base of the transistor 17 and the pulse signal $S_D$ is directly applied to the base of the transistor 20, the pulse signal $S_E$ is obtained at the junction of the collectors of the transistors 17 and 18 and the pulse signal $S_F$ is obtained at the junction of the collectors of the transistors 19 and 20. The NOR-circuit 14 is formed by two transistors 23 and 24 whose emitters are grounded and whose collectors are connected jointly to the voltage source +B through a resistor 25. If the pulse signal $S_F$ is applied to the base of the transistor 23 and the pulse signal $S_D$ is applied to the base of the transistor 24, the pulse signal $S_G$ is obtained at the connection point of the collectors of the transistors 23 and 24. Similar to the NOR-circuit 14, the NOR-circuit 15 is formed by two transistors 26 and 27 whose emitters are grounded and whose collectors are connected together to the voltage source +B through a resistor 28. If the pulse signal $S_G$ is applied to the base of the transistor 26 and the pulse signal $S_C$ is applied to the base of the transistor 27, the pulse signal $S_H$ is obtained at the junction of the collectors of the transistors 26 and 27 and the output terminal 16.

With the pulse waveform generator circuit as described above, the desired pulse signal $S_H$ is obtained without differentiating pulse signals $S_C$ and $S_D$. The trailing edges of pulse signals $S_C$ and $S_D$ trigger a level change in the waveform $S_H$ through the use of the RS-type flip-flop circuit 13 and the two logic circuits 14 and 15. It is apparent from FIG. 5 to one skilled in the art that an integrated circuit can be easily made with the above structural elements.

Circuits other than the NOR-circuits can be used as the first and second logic circuits 14 and 15. For example, as shown in FIG. 3B, an EXCLUSIVE OR-circuit may be used as the first logic circuit 14 by supplying it with the pulse signal $S_E$ opposite to the pulse signal $S_F$ from the RS-type flip-flop circuit 13 and with the pulse signal $S_D$ to produce the pulse signal $S_G$. Further, as shown in FIG. 3C, an OR-circuit may be used as the second logic circuit 15 to produce a pulse signal or waveform opposite to the above mentioned pulse signal $S_H$. Such a waveform would be equally useful in switching the video tape head outputs.

There is no need to limit the present invention to an input waveform $S_C$ and $S_D$ created by pulse producers and monostable multivibrators. Wherever the creation of a waveform $S_H$ triggered by the trailing edges of pulses with waveforms shaped as in $S_C$ and $S_D$ is desired, the invention can be applied.

It will be apparent to those skilled in the art that many modifications and variations may be effected without departing from the spirit and scope of the novel concepts of the present invention.

I claim as my invention:

1. A pulse waveform generator circuit comprising:
   a. a first pulse generator means for producing a first pulse signal with a predetermined pulse width;
   b. a second pulse generator means for producing a second pulse signal with a predetermined pulse width, said second pulse being produced between two successive first pulse signals;

c. a flip-flop circuit set by said first pulse signal at its leading edge and reset by said second pulse signal at its leading edge;

d. a first logic circuit supplied with an output signal of said flip-flop circuit and with said second pulse signal and producing a third pulse signal which is held in one state from the trailing edge of said second pulse signal to the leading edge of said first pulse signal; and e. a second logic circuit supplied with said third and first pulse signals and producing a fourth pulse signal which changes level at every arrival of the trailing edges of said first and second pulse signals.

2. A pulse waveform generator circuit as claimed in claim 1, in which said first logic circuit is a NOR-circuit.

3. A pulse waveform generator circuit as claimed in claim 1, in which said second logic circuit is a NOR-circuit.

4. A pulse waveform generator circuit as claimed in claim 2, in which said NOR-circuit comprises two transistors.

5. A pulse waveform generator circuit as claimed in claim 3, in which said NOR-circuit comprises two transistors.

6. A pulse waveform generator circuit as claimed in claim 1, in which said flip-flop circuit is an RS-type flip-flop circuit.

7. A pulse waveform generator circuit as claimed in claim 6, in which said RS-Type flip-flop circuit comprises four transistors.

8. A pulse waveform generator circuit as claimed in claim 1, in which said first logic circuit is an EXCLUSIVE OR-circuit which is supplied with a pulse signal from said flip-flop circuit reversed in phase from that in claim 1 and said second pulse signal.

9. A pulse waveform generator circuit as claimed in claim 1, in which said second logic circuit is an OR-circuit to produce a pulse signal reversed in phase from that obtained in claim 1.

10. A pulse waveform generator circuit as claimed in claim 1, in which said first pulse generator means includes a first pulse producer and a first monostable multivibrator, and said second pulse generator means includes a second pulse producer and a second monostable multivibrator.

11. A pulse waveform generator circuit as claimed in claim 9, in which said first and second pulse producers are secured adjacent to a rotary body on which a pair of rotary magnetic heads are secured.

12. In a video tape recording device having two rotary magnetic heads, first and second pulse producers located adjacent to said rotary magnetic heads, and means for creating first and second pulse signals with predetermined pulse widths triggered on outputs from said first and second pulse producers, the improvement which comprises:

a. a flip-flop circuit set by said first pulse signal at its leading edge and reset by said second pulse signal at its leading edge;

b. a first logic circuit supplied with an output signal of said flip-flop circuit and with said second pulse signal and producing a third pulse signal which is held in one state from the trailing edge of said second pulse signal to the leading edge of said first pulse signal; and c. a second logic circuit supplied with said third and first pulse signals and producing a fourth pulse signal which changes level at every arrival of the trailing edges of said first and second pulse signals.

* * * * *